US008962488B2

(12) United States Patent
Liao et al.

(10) Patent No.: US 8,962,488 B2
(45) Date of Patent: Feb. 24, 2015

(54) SYNCHRONIZED RADIO FREQUENCY PULSING FOR PLASMA ETCHING

(71) Applicant: Applied Materials, Inc., Santa Clara, CA (US)

(72) Inventors: Bryan Liao, Saratoga, CA (US); Katsumasa Kawasaki, Los Gatos, CA (US); Yashaswini Pattar, Palo Alto, CA (US); Sergio Fukuda Shoji, San Jose, CA (US); Duy D. Nguyen, Milpitas, CA (US); Kartik Ramaswamy, San Jose, CA (US); Ankur Agarwal, Mountain View, CA (US); Phillip Stout, Santa Clara, CA (US); Shahid Rauf, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/849,729

(22) Filed: Mar. 25, 2013

(65) Prior Publication Data

US 2013/0213935 A1    Aug. 22, 2013

Related U.S. Application Data

(63) Continuation of application No. 12/851,606, filed on Aug. 6, 2010, now Pat. No. 8,404,598.

(60) Provisional application No. 61/232,107, filed on Aug. 7, 2009.

(51) Int. Cl.
*H01L 21/302* (2006.01)
*C23F 1/00* (2006.01)
*H01J 37/32* (2006.01)
*H01L 21/311* (2006.01)

(52) U.S. Cl.
CPC .............. *C23F 1/00* (2013.01); *H01J 37/32082* (2013.01); *H01J 37/32146* (2013.01); *H01J 37/32165* (2013.01); *H01L 21/31116* (2013.01)
USPC .......................... 438/714; 216/68; 156/345.48

(58) Field of Classification Search
USPC ................... 438/10, 706, 710, 712, 714, 729; 216/67, 68, 71; 156/345.45, 345.47, 156/345.44, 345.48
See application file for complete search history.

(56) References Cited

U.S. PATENT DOCUMENTS

| | | |
|---|---|---|
| 7,718,538 B2 | 5/2010 | Kim et al. |
| 7,737,042 B2 | 6/2010 | Kim et al. |
| 7,771,606 B2 | 8/2010 | Kim et al. |
| 8,404,598 B2 * | 3/2013 | Liao et al. ...................... 438/714 |
| 2007/0245959 A1 * | 10/2007 | Paterson et al. ............. 118/723 I |
| 2008/0053818 A1 | 3/2008 | Ui |
| 2008/0110859 A1 * | 5/2008 | Koshiishi et al. ................ 216/67 |
| 2009/0004837 A1 | 1/2009 | Rouh et al. |
| 2009/0284156 A1 | 11/2009 | Banna et al. |
| 2010/0248488 A1 | 9/2010 | Agarwal et al. |

\* cited by examiner

*Primary Examiner* — Lan Vinh
(74) *Attorney, Agent, or Firm* — Moser Taboada; Alan Taboada (57) ABSTRACT

Methods for processing a substrate are provided herein. In some embodiments, a method of etching a dielectric layer includes generating a plasma by pulsing a first RF source signal having a first duty cycle; applying a second RF bias signal having a second duty cycle to the plasma; applying a third RF bias signal having a third duty cycle to the plasma, wherein the first, second, and third signals are synchronized; adjusting a phase variance between the first RF source signal and at least one of the second or third RF bias signals to control at least one of plasma ion density non-uniformity in the plasma or charge build-up on the dielectric layer; and etching the dielectric layer with the plasma.

15 Claims, 6 Drawing Sheets

SYNCHRONIZED RADIO FREQUENCY PULSING FOR PLASMA ETCHING

CROSS-REFERENCE TO RELATED APPLICATIONS

This application is a continuation of co-pending U.S. patent application Ser. No. 12/851,606, filed Aug. 6, 2010, which claims benefit of U.S. provisional patent application Ser. No. 61/232,107, filed Aug. 7, 2009. Each of the aforementioned related patent applications is herein incorporated by reference.

FIELD

Embodiments of the present invention generally relate to methods of processing a substrate.

BACKGROUND

Conventional plasma etching of dielectric structures on workpieces has issues of reactive ion etch (RIE) lag (e.g., aspect ratio dependent etching), etch stop, or twisting of features etched. This is due in part to both competing polymer deposition mechanism using a fluorocarbon etch chemistry, and positive charging of the structure walls from predominantly positive ion fluxes and unequal electron fluxes down the depth of the structure. In addition, this charging leads to selectivity and damage issues, especially to the soft films encountered in dielectric etching. For example, some materials, such as insulating materials (e.g., dielectric materials) can charge during plasma etch processing. The charging of the material can result in damage, destruction, or over-etching of the material due to, for example, increased flux of a plasma species at a charged surface of the material.

Solutions to the surface charging problem include, for example, pulsing the RF source and bias frequencies to dissipate charge from the surface of the material. Typically, the pulsing of the RF source and bias signals is synchronized such that each RF signal is completely aligned, e.g., each signal is in phase and has the same duty cycle. Unfortunately, this type of synchronization does not effectively compensate for variations in the plasma due to the pulsing process which can result in a non-uniform plasma and a poorly controlled etch rate.

SUMMARY

Methods for processing a substrate are provided herein. In some embodiments, a method of etching a dielectric layer on a substrate may include generating a plasma by pulsing a first RF source signal having a first duty cycle; applying a second RF bias signal having a second duty cycle to the plasma; applying a third RF bias signal having a third duty cycle to the plasma, wherein the first, second, and third signals are synchronized; adjusting a phase variance between the first RF source signal and at least one of the second or third RF bias signals to control at least one of plasma ion density non-uniformity in the plasma or charge build-up on the dielectric layer; and etching the dielectric layer with the plasma.

In some embodiments, a method of etching a dielectric layer on a substrate disposed on a substrate support of a capacitively coupled plasma etching reactor having an upper electrode disposed above the substrate and a lower electrode disposed in the substrate support is provided. The method may include generating a plasma to etch the dielectric layer by pulsing a first RF source signal coupled to the upper electrode, the first RF source signal having a first duty cycle; applying a second RF bias signal having a second duty cycle to the lower electrode; applying a third RF bias signal having a third duty cycle to the lower electrode, wherein the first, second, and third signals have a common pulse frequency; and adjusting at least one of a phase variance or a duty cycle of the first RF source signal with respect to at least one of the second or third RF bias signals to control at least one of plasma ion density non-uniformity, charge build-up on the dielectric layer, or etch rate of the dielectric layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods of processing a substrate are provided herein. The inventive methods may advantageously reduce charge-up on surfaces of a substrate, such as a dielectric layer, while improving plasma uniformity and etch rate control. The inventive methods may advantageously benefit low or high aspect ratio etching and act towards preventing charging damage in low k dielectric materials.

Figure 1:
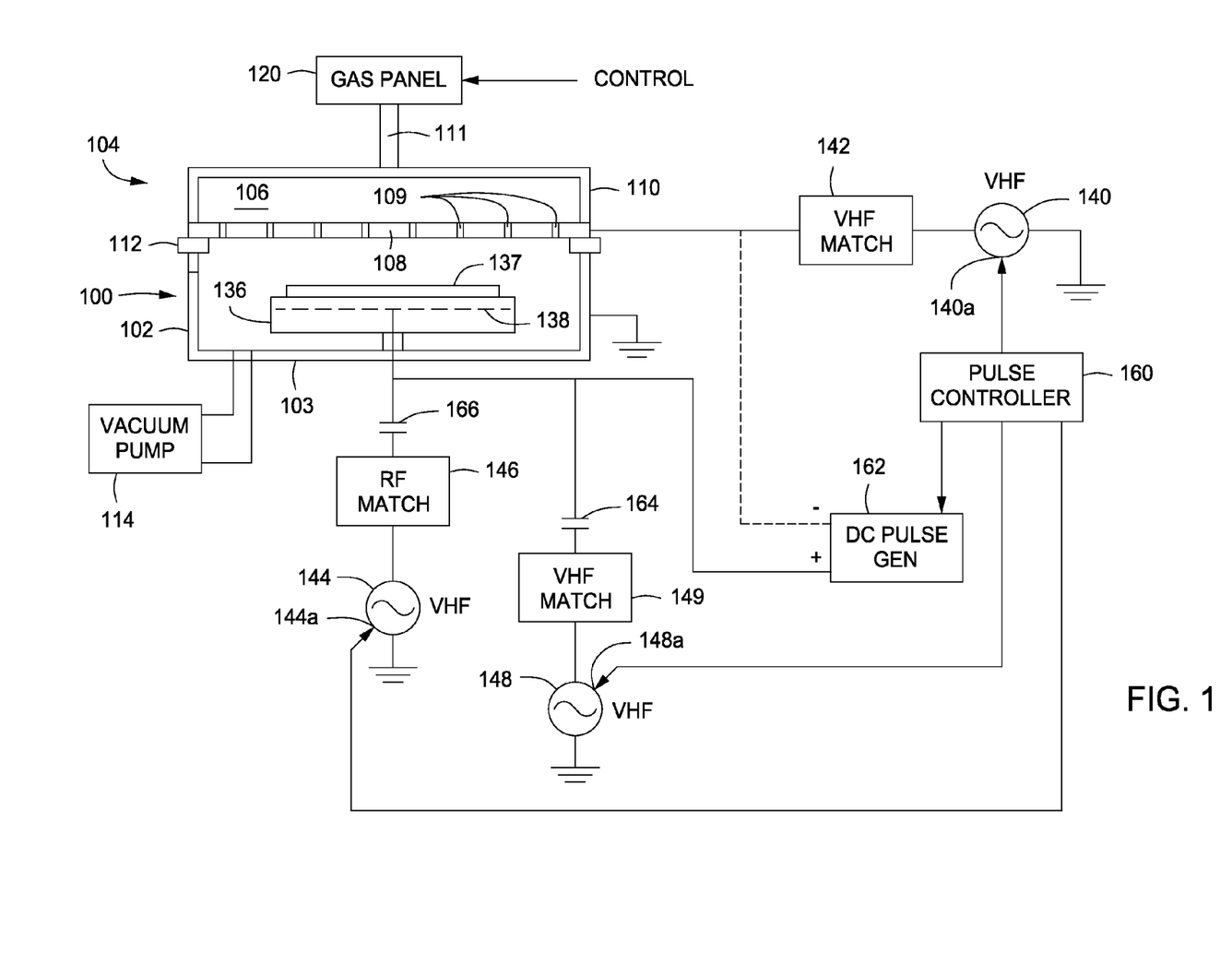
FIG. 1 depicts a plasma reactor in accordance with some embodiments of the present invention.

FIG. 1 depicts a plasma reactor which may be utilized to perform the inventive methods disclosed herein. The inventive methods may be performed in a capacitively coupled plasma reactor (e.g., as illustrated in FIG. 1) or any other suitable plasma reactor, such as an inductive coupled plasma reactor. However, the inventors have observed that the inventive methods can be particularly beneficial in capacitively coupled plasma reactors, such as where high bias power (e.g., about 2000 W or more) and low source power (e.g., about 500 W or less) is used, as undesired charging effects can be much more severe than, for example, in inductively coupled plasma processing chambers. In some embodiments, the inventors have discovered that the present inventive methods provide particular benefit in configurations where at least one of a DC bias ($V_{DC}$), a $V_{RF}$, or a plasma sheath voltage are at or above about 1000V.

The reactor of FIG. 1 includes a reactor chamber 100 enclosed by a cylindrical side wall 102, a floor 103 and a ceiling 104. The ceiling 104 may be a gas distribution showerhead including a gas manifold 106 overlying a gas distribution plate 108 having orifices 109 formed through the plate 108. The gas manifold is enclosed by a manifold enclosure 110 having a gas supply inlet 111. The gas distribution showerhead 104 is electrically insulated from the cylindrical side wall 102 by an insulating ring 112. A vacuum pump 114, such a turbomolecular pump, evacuates the chamber 110. A gas panel controls the individual flow rates of different process gases to the gas supply inlet 111. A workpiece support pedestal 136 supported through the chamber floor 103 may have an insulating top surface and an internal electrode 138. The internal electrode may, for example, be used for chucking a semiconductor workpiece 139 on the top surface of the support pedestal 138. Plasma source power is applied to the ceiling (gas distribution showerhead) 104 from a VHF source generator 140 through a VHF impedance match 142. The ceiling or gas distribution showerhead is formed of a conductive material, such as aluminum for example, and therefore serves as a ceiling electrode. The VHF source generator 140 may generate VHF power in the high portion of the VHF spectrum, such as in a range of 100 to 200 MHz. The VHF source generator 140 has the capability of pulsing the VHF power it generates at a desired pulse rate and duty cycle. For this purpose, the VHF source generator 140 has a pulse control input 140a for receiving a control signal or signals defining the pulse rate and/or duty cycle as well as the phase of each pulse produced by the VHF generator 140.

Plasma bias power is applied to the wafer support electrode 138 from an RF bias generator 144 through an RF impedance match 142, and RF bias generator 148 through an RF impedance match 149. The RF bias generators 144, 148 may generate HF or LF power in the low portion of the HF spectrum or in the MF or LF spectrum, such as in a range of 13.56 MHz or a on the order of 1-2 MHz. The RF bias generators 144, 148 have the capability of pulsing the RF bias power generated at a desired pulse rate and duty cycle. For this purpose, the RF bias generators 144, 148 have pulse control inputs 144a, 148a for receiving a control signal or signals defining the pulse rate and/or duty cycle as well as the phase of each pulse produced by the RF generators 144,148. The RF bias generators 144, 148 may be independently pulsed, phased, and/or duty cycle controlled. Further, the RF bias generators 144, 148 may be pulsed synchronously or asynchronously.

Optionally, plasma source power may be applied to the wafer support electrode 138 from a second VHF generator through a VHF impedance match (not shown). The second VHF generator may generate VHF power in the low portion of the VHF spectrum, such as in a range of 50 to 100 MHz. The second VHF generator has the capability of pulsing the VHF power it generates at a desired pulse rate and duty cycle. For this purpose, the second VHF generator has a pulse control input for receiving a control signal or signals defining the pulse rate and/or duty cycle as well as the phase of each pulse produced by the second VHF generator. For example, in some embodiments, one of the RF bias generators 144, 148 and its components (e.g., match, pulse control inputs, etc.) can be replaced with the second VHF generator and its components. Alternatively, the second VF generator and its components may be included in addition to the first VHF generator 140, and the bias generators 144, 148 and their respective components.

A pulse controller 160 is programmable to apply pulse control signals to each of the pulse control inputs 140a, 144a, 148a of the RF generators 140, 144, 148, to produce the desired phase lead or lag relationship and/or duty cycle relationship among the pulses of the VHF source power generator 140 and the RF bias power generator 144, 148.

Further, a D.C. pulse generator 162 may be coupled to either (or both) the wafer support electrode 138 and the ceiling 104. The pulse repetition rate, phase and duty cycle of the D.C. pulse generator are controlled by the pulsed controller 160. A D.C. isolation capacitor 164, 166 may be provided to isolate each RF generator from the D.C. pulse generator 162. A DC signal generated by the DC generator may be synchronized with the RF signals generated by the generators 140, 144, and 148 to provide benefits such as reduced charge-up on a substrate 137 or improved etch rate control of the substrate using a plasma formed in the plasma reactor.

Figure 2A:
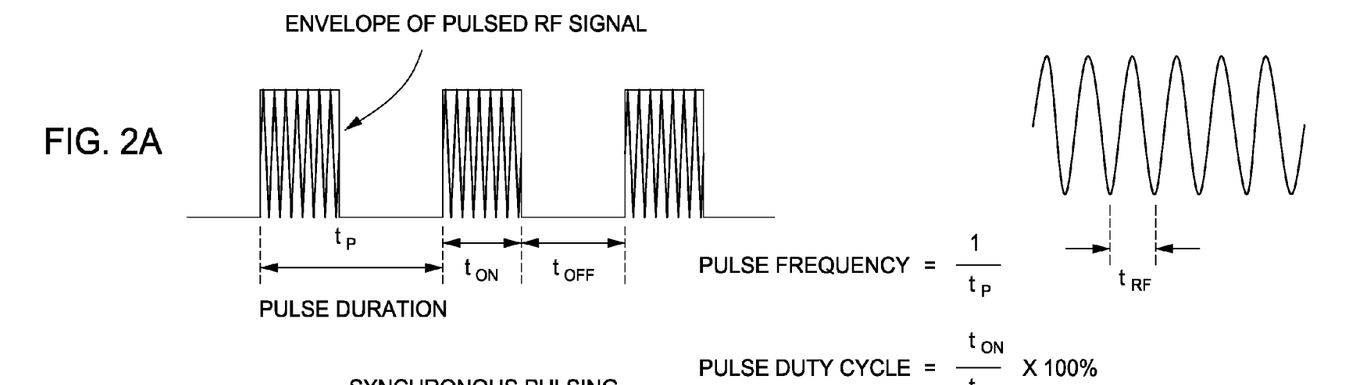
FIG. 2A-C depicts pulsed waveforms of radio frequency signals in accordance with some embodiments of the present invention.

FIG. 2A depicts a time domain waveform diagram that may reflect the pulsed RF output of each of the generators 140, 144, 148, showing the pulse envelope of the pulsed RF output, characterized by the following parameters controlled by the pulse controller 160 individually for each generator 140, 144, 148: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

Figure 2B:
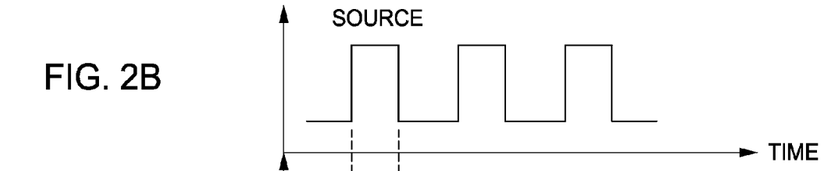
Figure 2C:
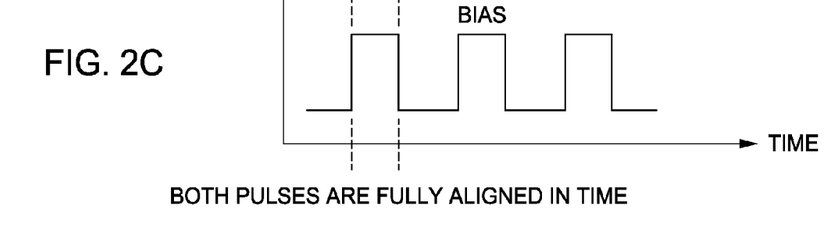

FIGS. 2B and 2C depict contemporaneous time domain waveforms of pulsed VHF source power and pulsed RF bias power synchronized together in such a manner that they have identical phase and duty cycle and therefore a phase difference of zero between them. The exemplary embodiment depicted in FIGS. 2B and 2C is one exemplary form of synchronization between a pulsed source signal and a pulsed bias signal. In this exemplary embodiment, both the phase and duty cycle of each pulsed signal is the same.

Figure 3A:
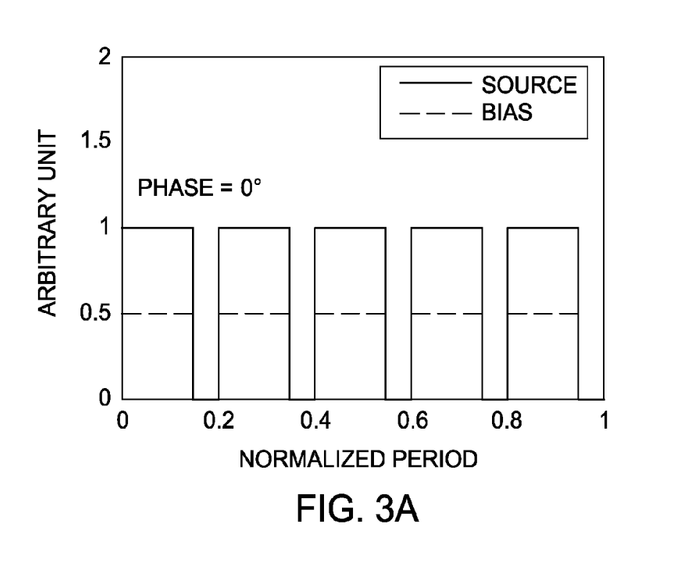
FIG. 3A-D depicts phase variance between pulsed waveforms in accordance with some embodiments of the present invention.
Figure 3B:
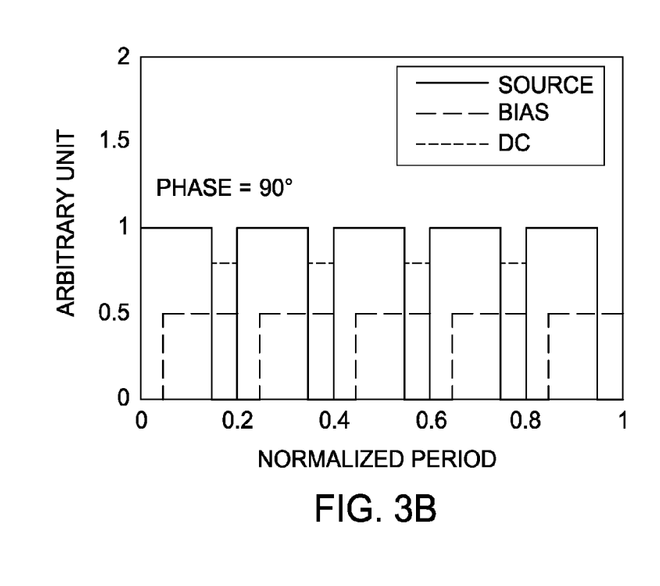
Figure 3C:
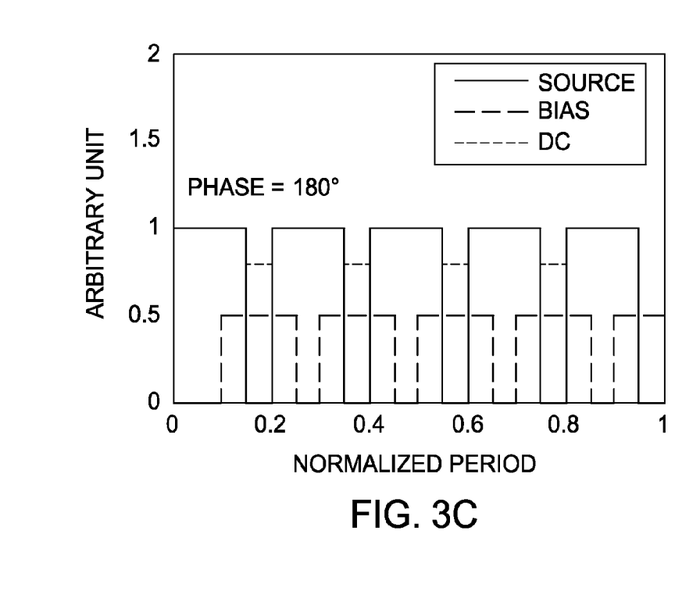
Figure 3D:
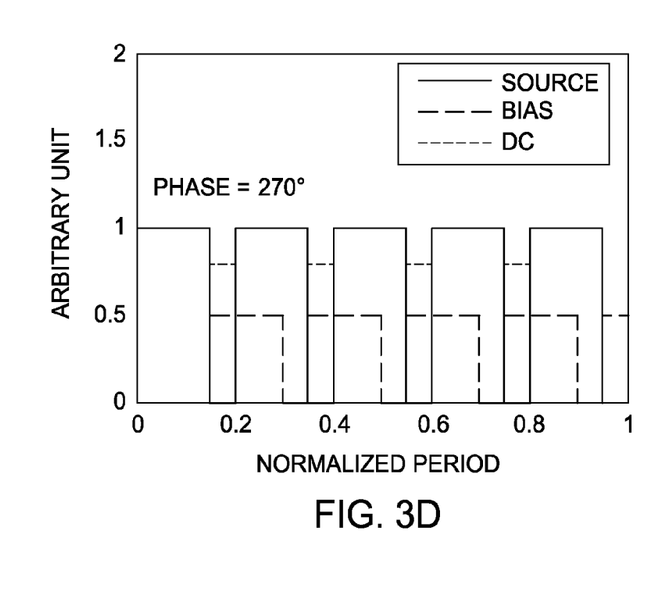

In some embodiments of the present invention, the pulsed signals provided by the source and bias generators 140, 144, and 148 are varied in phase. FIGS. 3A through 3D illustrate how the phase difference may be varied by the pulse controller 160, and depict the superposition of the source and bias power waveforms at phase differences of 0°, 90°, 180° and 270°, respectively, where the phase difference is defined by how much the bias pulse output lags the source pulse output. FIG. 3A corresponds to the example of zero phase difference of FIG. 28. FIG. 3B depicts a case in which the bias power pulse output lags the source power pulse output by 90°. FIG. 3C depicts a case in which the bias power pulse output lags the source power pulse output by 180 degrees. FIG. 3D depicts a case in which the bias power pulse output lags the source power pulse output by 270°.

FIGS. 3A through 3D depict a duty cycle of 75% for all pulse outputs. However, the duty cycle may be less, for example about 40% for all pulse outputs. In some embodiments, the duty cycles for RF signals generated by each of the generators 140, 144, 148 are the same. Alternatively, in some embodiments, one or more of the duty cycles may be different. For example, the RF signals from the generators 140, 144 may be synchronized together with a phase lag between with a duty cycle of 45% while the RF bias power generator 148 may have a duty cycle of 35%. However, the RF signal generated by the generator 148 may be synchronous with respect to the synchronous RF signals generated by the generators 140, 144 provide that it has the same pulse duration as the other two RF signals.

In some embodiments, during each "off" time of the VHF source power pulse output, a negative D.C. pulse may be applied to the wafer support electrode 138 and/or a positive D.C. pulse may be applied to the ceiling 104, from the D.C. pulse generator 162. This is depicted in the dotted line waveforms of FIGS. 3B, 3C and 3D. This feature may boost positive ion flux to the workpiece during the source power "off" time when positive ions are plentiful, to equalize the average flux of positive and negative ions over each complete cycle. This equalization may be optimized by controlling the voltage of the D.C. pulse generator 162.

In some embodiments, etching rates may be enhanced while pulsing the plasma by controlling the phase lead or lag of the RF envelopes. When the source and bias are pulsed independently out-of-phase, or with varying duty cycle, the different plasma dynamics of the very high frequency (VHF) and low frequency (LF) allow for better plasma fill over the entire pulse. In some embodiments, a combination of VHF of about 162 MHz source frequency is used in conjunction with a bias frequency of about 13.56 MHz and another bias frequency of about 2 MHz. In some embodiments, a combination of VHF of about 162 MHz source frequency is used in conjunction with a bias frequency of about 60 MHz and another bias frequency of about 2 MHz. In some embodiments, a source frequency of about 60 MHz is used in combination with bias frequencies of about 2 MHz and/or about 13.56 MHz.

A pulse repetition frequency may range from about 0.1 KHz to about 20 KHz, which is synchronized between all generators (e.g., all generators share the same pulse repetition frequency or an integral multiple thereof). The pulse duty cycle (time for which power is supplied) may independently vary from about 10% to about 90% for each generator. In addition, the phase lag between each generator may be controlled. By controlling the overlap between the RF envelopes of the pulses, the plasma ion density non-uniformity can be minimized. For example, a low frequency (LF) signal may produce a predominantly higher edge plasma ion density, and a very high frequency (VHF) signal may produce a predominantly higher central region plasma ion density. Pulsing the source and bias with moderate phase lag can thus be used to achieve enhanced etch rates despite the lower time averaged power deposition as compared to continuous mode. The higher etch rates are favored owing to a combination of VHF-off/LF-on period(s) during the pulse which increases the LF voltage(s) and the DC self-bias as the VHF power is turned off, giving a boost to the ion energies. The tuning of this overlap also controls the ion flux levels.

Thus, an etch rate of a process may be controlled or tuned by changing the phase lag between the source and bias pulse outputs. The phase lag affects or tunes the ion energies and the fluxes at the workpiece surface. For example, for a phase lag of 90°, etch rates are higher as high energy ions will have a large flux. This is because the VHF source pulse is already "on" at the beginning of the bias pulse, which leads to high fluxes, and when the source pulse ends ("off") then the on-phase of bias pulse will leads to high ion energies. A similar analysis applies to other phase lags. For a phase lag of 180° although the ion energies will be higher (as the VHF source is off at the beginning of the bias power pulse), the flux will also be lower (because, again, the source power pulse is off at the beginning of the bias power pulse in this case). As a result, the time-averaged ion fluxes are lower throughout the entire cycle so that the etch rate is expected to be low (it may be lowest at 180° phase lag). A phase lag of 270° is similar in principle to a phase lag of 90°, so that the etch rate behavior will be similar, although the etch rate at 270° will be slightly less than at 90° phase lag. Therefore, the process etch rate is controlled by varying the phase between the VHF source power pulse output of the generators 140 and the bias power pulse output of the generator 144, 148.

Figure 4A:
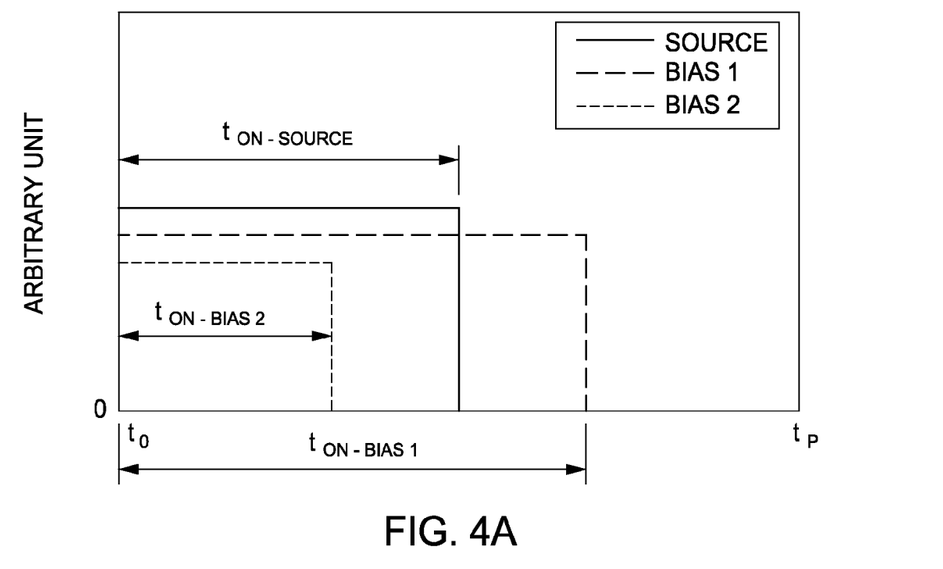
FIG. 4A-B depicts duty cycle and/or phase variation between pulsed waveforms in accordance with some embodiments of the present invention.

Alternatively, a synchronization of the RF source and bias signals can be achieved by providing each signal in-phase and varying duty cycle. FIG. 4A depicts duty cycle variation between pulsed waveforms in accordance with some embodiments of the present invention. For example, the source and bias signals may be in-phase as shown with each signal having a different duty cycle. As depicted in FIG. 4, the "on" periods of each duty cycle begin at time zero of the pulse duration $t_P$ and have varying "off" periods. For example, (not shown) the source and bias signals may be in-phase, with the source signal having a shorter duty cycle that either of the bias signals. Hence, the source signal enters an "off" period while each bias signal is still in an "on" period. The foregoing example may be advantageous for creating higher sheath voltages and ion energies, which may increase the etch rate of the material being etched.

Figure 4B:
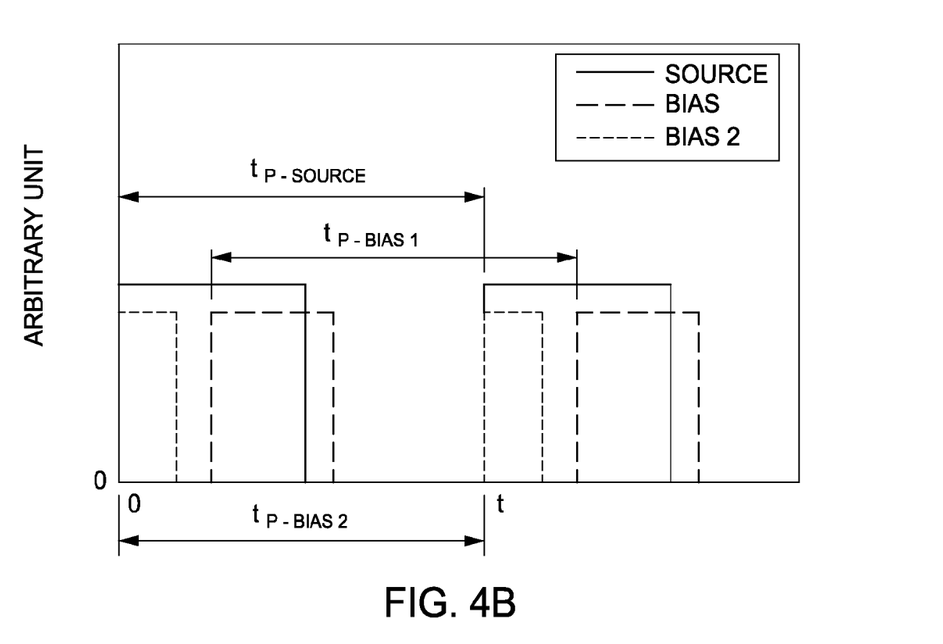

Alternatively or in combination, one or more of the RF source and bias signals can be provided with a phase lead or lag with respect to each other. However, for synchronization to be achieved, the pulse duration of each signal should be the same or an integer multiple thereof. For example, in FIG. 4B, the $t_{P-SOURCE}$, $t_{P-BIAS1}$, and $t_{P-BIAS2}$ are equivalent, and the source, bias 1, and bias 2 signals are synchronized. The bias 1 signal has both a phase lag and different duty cycle with respect to the source and bias 2 signals. The bias 2 signal has a different duty cycle with respect to the source signal. However, because each signal has an equivalent $t_P$, the signals remain synchronized even though at least one of phase or duty cycle differs between them.

Figure 5:
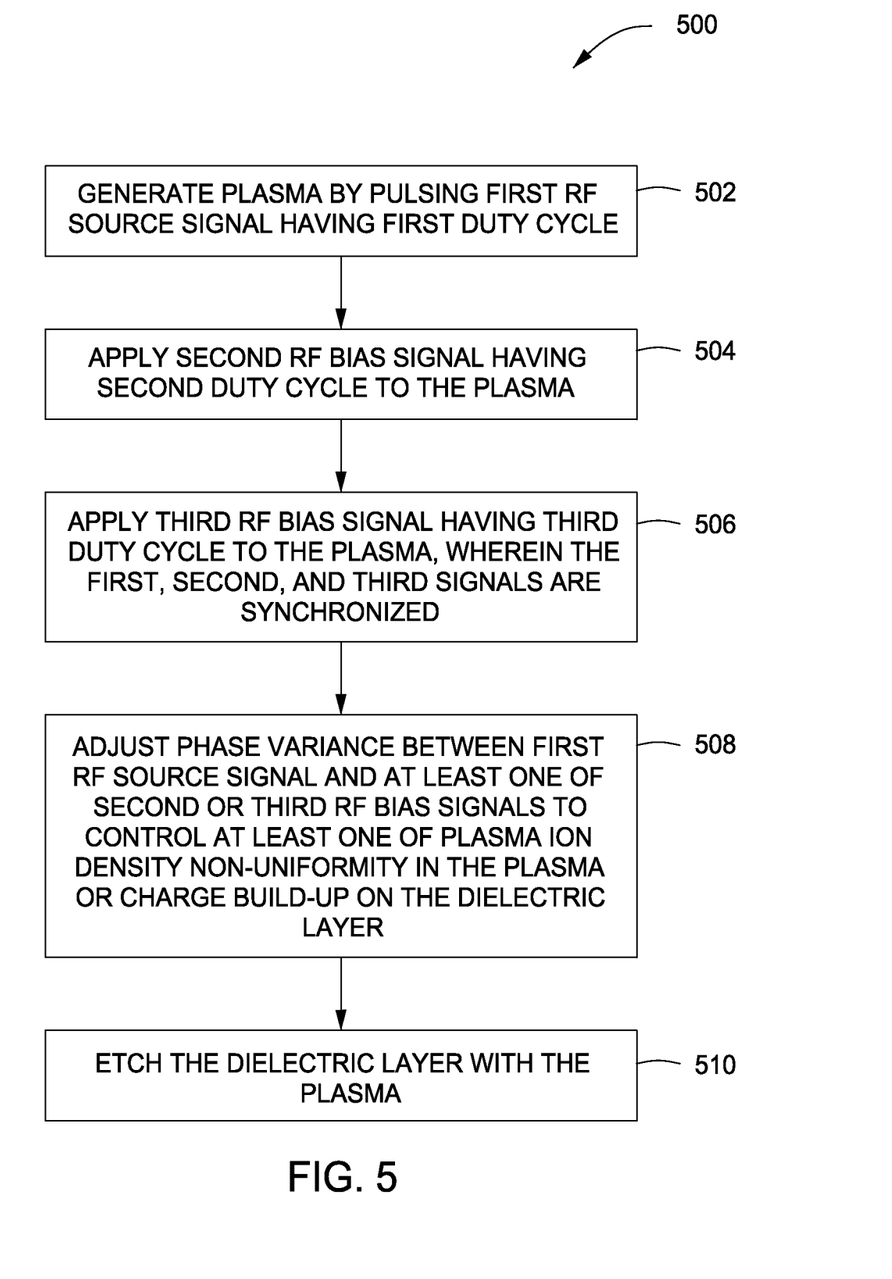
FIG. 5 depicts a flow chart of a method for processing a substrate in accordance with some embodiments of the present invention.

FIG. 5 depicts a flow chart of a method 500 for processing a substrate in accordance with some embodiments of the present invention. The method 500 may be performed, for example, in the plasma reactor discussed above in FIG. 1. The method 500 begins at 502 by generating a plasma by pulsing a first RF source signal having a first duty cycle, for example, such as a signal provided by the generator 140. The first RF source signal may be provided at an RF frequency of between about 60 MHz to about 162 MHz. In some embodiments, the RF frequency of the first RF source signal is about 162 MHz. In some embodiments, the RF frequency of the first RF source signal is about 60 MHz.

At 504 and 506, the first RF source signal may be synchronized with a pulsed second and third RF bias signals. For example, the second RF bias signal may be provided by the generator 144 and the third RF bias signal may be provided by the generator 148. The second and third RF bias signals may be provided at an RF frequency of between about 2 MHz to about 60 MHz. In some embodiments, the second and third RF bias signals are provided at RF frequencies of about 2 MHz and about 13.56 MHz, respectively. In some embodiments, the second and third RF bias signals are provided at RF frequencies of about 2 MHz and about 60 MHz, respectively. In some embodiments, a pulse frequency of each RF signal is between about 0.1 KHz to about 20 KHz. In some embodiments, the pulse frequency of each RF signal is the same.

At 508, the phase variance may be adjusted between first RF source signal and at least one of second or third RF bias signals to control at least one of plasma ion density non-uniformity in the plasma or charge build-up on the dielectric layer. At 510, the dielectric layer may be etched with the plasma. In some embodiments, the first, second, and third RF signals are synchronized while varying the phase between one or more of the first, second, and third RF signals, for example, to minimize charge-up on, and/or control etch rate of, the substrate 137. The phase of each signal may be varied to either lead or lag one or more of the other signals. In some embodiments, the pulse duration of each of the first, second, and third RF signals is the same when the phase of each RF signal is varied. In some embodiments, the duty cycle of each RF signal is the same when the phase of each signal is varied. The varying phase between, for example, source and bias signals may be utilized to minimize plasma ion density non-uniformity. For example, a low frequency signal (e.g., bias signal) can produce a higher edge plasma ion density, and a high frequency signal (e.g., source signal) can produce a higher central region plasma ion density. By adjusting the phase of, for example, the high frequency signal with respect to the low frequency signal, the plasma ion density non-uniformity can be minimized.

For example, and in some embodiments, to minimize charging effects on the substrate 137 where the material is not a good conductor (e.g., a dielectric material), source and bias power may be pulsed synchronously, but with the bias "on" envelope applied when the source power is "off" (e.g., a phase difference of 180° at a duty cycle of 50%). The time window during which the pulsed source power is "off" may be referred to as the "decay phase" or the pulsed source power "off" phase. In a polysilicon plasma etch process using a process gas with electronegative chemistry such as $Cl_2$, negatively charged $Cl^-$ ions may form during the "decay phase" when the source power is "off". Under appropriate conditions, the number density of negative ions may greatly exceed the number density of electrons, and may be nearly equal to the number density of positive ions that form during the source power "on" phase. If the bias power is applied during the source power "off" phase, then the workpiece being etched may be bombarded with nearly equal fluxes of positive and negative ions during the two phases. Specifically, the substrate 137 is bombarded with predominantly positive ions during the source power "on" phase and with negative ions during the bias power "on" phase (e.g., source power decay or "off" phase). If the substrate 137 being etched is bombarded with alternating (per RF cycle) equal fluxes of oppositely charged (equal mass) ions, then no net charging (time average) of the substrate 137 should occur.

In some embodiments, the first, second, and third RF signals are synchronized by varying the duty cycle between one or more of the first, second, and third RF signals, for example, to minimize charge-up on, and/or control etch rate of, the substrate 137. In some embodiments, the pulse frequency of each of the first, second, and third RF signals is the same when the duty cycle is varied. In some embodiments, the phase of each of the first, second, and third RF signals is the same when the duty cycle is varied.

In some embodiments, the first, second, and third RF signals are synchronized by varying at least one of the duty cycle or the phase between one or more of the first, second and third RF signals. For example, the first RF signal (e.g., the source signal) may have a higher duty cycle than the second and/or third signals (e.g., bias signals) which can result in a higher plasma density over the pulse period. Further, the second and/or third signals can be pulsed with a phase lag with respect to the first signal to minimize ion acceleration across the plasma sheath during an initial part of the second and/or third signal pulse which can moderate ion energy and reduce ion bombardment damage on the substrate 137. Alternatively, the ion acceleration may be increased, for example, by pulsing the second and/or third signals with a phase lead with respect to the first signal. The amount of overlap signal may be utilized to increase or decrease the average ion energy. Duty cycle variation can also be used to control the ion energy. For example, a source duty cycle longer than the bias duty cycles may be used to lower the ion energy, while a bias duty cycle that is longer than the source duty cycle can be used to raise the ion energy. In some embodiments, the power levels of the RF generators may also be controlled to control the ion energy of the plasma.

For example, and in some embodiments, etching of dielectric materials such as silicon dioxide selective to mask layers or underlayers is typically performed using a fluorocarbon chemistry, such as $CF_4$ or $C_4F_6$, in conjunction with an oxidizer such as $O_2$ or CO, and sometimes hydrogen or hydrocarbon chemistry as well. Typically, an electropositive gas such as Ar is added as a diluent. Unfortunately, the typical dielectric etch process gas chemistries do not form a significant population of negative ions; that is, the number density of electrons far exceeds the number density of negative ions. Consequently, there are unequal fluxes of oppositely charged ions to the substrate 137, leading to charging. Pulsing the plasma decreases plasma-on time, which can limit at least to some degree the charge damage, because the collapsed sheath allows for neutralization of accumulated charge. However, that is not a complete solution to the charging problem. Moreover, it does not address a problem of non-uniform radial distribution of plasma ion density.

Uniformity of the radial distribution of plasma ion density is improved in a pulsed RF plasma dielectric etch process. One embodiment uses the phase lead or lag of the RF envelopes of the pulsed RF source power and the pulsed RF bias power to improve uniformity. In some embodiments, VHF source power and HF (and/or LF) bias power are pulsed independently with a phase lead or lag between the source and bias power pulses. The plasma ion distribution responds differently to application of the different frequencies, enabling the ion distribution to be adjusted by adjusting the phase lead or lag. The different distributions attained during the different phases of each cycle average out over a complete cycle to a more uniform distribution. In one embodiment, a combination of a source power frequency in the low region of the VHF range (e.g., 60 MHz) is used in conjunction with a bias power frequency of 13.56 MHz. The bias frequency may produce a predominantly higher edge plasma ion density, and the low frequency VHF may produce a predominantly higher central region plasma ion density. In some embodiments, a pulse repetition frequency of about 6 kHz (166.67 ps pulse period) is used for the RF generators supplying the VHF source power and the HF bias power. However, any suitable pulse frequency can be utilized, for example, such as any pulse frequency in the range provided above. By adjusting the overlap between the RF envelopes of the source power and bias power pulses, the plasma ion density non-uniformity can be minimized. This adjustment may be carried out as follows: if it is desired to make the ion distribution more center high, then the source and bias power pulse envelopes are adjusted to increase the source power "on" duty cycle relative to the bias power "on" duty cycle. If it is desired to make the ion distribution more edge high, then the source and bias power pulse envelopes are adjusted to increase the bias power "on" duty cycle relative to the source power "on" duty cycle.

In some embodiments, a pulsed DC signal may be supplied, for example, from the DC pulse generator 162 to maintain a constant chucking force on the substrate 137 during plasma processing. For example, the chucking force can vary with the charge on the substrate 137 and cause damage or cracking of the substrate if not properly maintained. Further, variation in the chucking force may lead to variation in heat transfer from the substrate to the substrate support, undesirably leading to process variation and/or rejected substrates.

The pulsed DC signal can be synchronized with one or more of the first, second, or third RF signals, for example, to provide a constant chucking force during plasma processing. In some embodiments, the pulsed DC signal is synchronized to be in phase with the first RF signal (e.g., source signal). For example, when the source signal is "on", the DC signal is "on." When the source signal is "off", the DC signal may be "off." Alternatively, the DC signal may be provided at "high" and "low" levels that respectively correspond with the on and off periods of the RF signal.

Thus, methods of processing substrates using synchronized pulsed RF signals are provided herein. The inventive methods may advantageously reduce charge-up on surfaces of a substrate, such as dielectric layers, and may also improve plasma uniformity and etch rate control.

While the foregoing is directed to embodiments of the present invention, other and further embodiments of the invention may be devised without departing from the basic scope thereof.

The invention claimed is:

1. A method of etching a dielectric layer on a substrate, comprising:
   generating a plasma by pulsing a first RF source signal having a first duty cycle;
   applying a second RF bias signal having a second duty cycle to the plasma;
   applying a third RF bias signal having a third duty cycle to the plasma, wherein the first, second, and third signals are synchronized;
   adjusting a phase variance between the first RF source signal and at least one of the second or third RF bias signals to control at least one of plasma ion density non-uniformity in the plasma or charge build-up on the dielectric layer, wherein an RF frequency of the first RF signal is a very high frequency (VHF) frequency, and wherein an RF frequency of each of the second RF bias signal and the third RF bias signal is a low frequency (LF), medium frequency (MF), or high frequency (HF) frequency; and
   etching the dielectric layer with the plasma.

2. The method of claim 1, wherein adjusting the phase variance further comprises:
   providing at least one of second or third RF bias signals having a phase lag relative to the first RF source signal to reduce plasma ion density non-uniformity relative to in-phase RF signals.

3. The method of claim 1, wherein adjusting the phase variance further comprises:
   providing at least one of second or third RF bias signals having a phase lag relative to the first RF source signal to reduce plasma ion energy relative to in-phase RF signals.

4. The method of claim 1, wherein adjusting the phase variance further comprises:
   providing at least one of second or third RF bias signals having a phase lag relative to the first RF source signal to reduce charge build-up on the dielectric layer relative to in-phase RF signals.

5. The method of claim 1, further comprising:
   increasing the first duty cycle relative to at least one of the second or third duty cycles to form a center high plasma ion density distribution.

6. The method of claim 1, further comprising:
   decreasing the first duty cycle relative to at least one of the second or third duty cycles to form an edge high plasma ion density distribution.

7. The method of claim 1, wherein an RF frequency of the first RF signal is about 50 to about 200 MHz, and wherein an RF frequency of each of the second RF signal and the third RF signal is about 2 to about 60 MHz.

8. The method of claim 1, wherein an RF frequency of the first RF signal is about 60 to about 162 MHz, and wherein an RF frequency of each of the second RF signal and the third RF signal is about 2 to about 60 MHz.

9. The method of claim 1, wherein a pulse frequency of each of the first, second, and third RF signals is between about 0.1 KHz to about 20 KHz and wherein the pulse frequency is the same for each RF signal.

10. The method of claim 1, wherein the duty cycle of each signal can be varied independently between about 10% to about 90%.

11. The method of claim 1, wherein the first, second, and third duty cycles are the same.

12. The method of claim 1, wherein the substrate is disposed in a capacitively coupled plasma etching reactor having the first RF source signal coupled to an upper electrode and the second and third RF bias signals are coupled to a lower electrode disposed in a substrate support of the reactor.

13. The method of claim 1, further comprising:
    applying a pulsed DC signal which is synchronized with the first RF source signal.

14. The method of claim 13, wherein the pulsed DC signal is in-phase with the first RF source signal.

15. A method of etching a dielectric layer on a substrate disposed on a substrate support of a capacitively coupled plasma etching reactor having an upper electrode disposed above the substrate and a lower electrode disposed in the substrate support, comprising:
    generating a plasma to etch the dielectric layer by pulsing a first RF source signal coupled to the upper electrode, the first RF source signal having a first duty cycle;
    applying a second RF bias signal having a second duty cycle to the lower electrode;
    applying a third RF bias signal having a third duty cycle to the lower electrode, wherein the first, second, and third signals have a common pulse frequency; and
    adjusting at least one of a phase variance or a duty cycle of the first RF source signal with respect to at least one of the second or third RF bias signals to control at least one of plasma ion density non-uniformity, charge build-up on the dielectric layer, or etch rate of the dielectric layer, wherein an RF frequency of the first RF signal is a very high frequency (VHF) frequency, and wherein an RF frequency of each of the second RF bias signal and the third RF bias signal is a low frequency (LF), medium frequency (MF), or high frequency (HF) frequency.

* * * * *